United States Patent [19]

Spähn

[11] Patent Number: 4,672,230

[45] Date of Patent: Jun. 9, 1987

[54] ELECTRONIC PROXIMITY SWITCH DEVICE

[75] Inventor: Hans P. Spähn, Tettnang, Fed. Rep. of Germany

[73] Assignee: IFM Electronic GmbH, Essen, Fed. Rep. of Germany

[21] Appl. No.: 756,813

[22] Filed: Jul. 18, 1985

[30] Foreign Application Priority Data

Jul. 26, 1984 [DE] Fed. Rep. of Germany ....... 3427498

[51] Int. Cl.$^4$ .......................................... H01H 35/00
[52] U.S. Cl. ................................... 307/116; 307/117; 361/179; 323/351; 340/600; 324/200
[58] Field of Search ................ 307/116, 117; 361/139, 361/160, 180, 179; 340/547, 550, 551, 552, 565, 567, 568, 572, 600; 324/200; 363/126; 323/282, 349, 351

[56] References Cited

U.S. PATENT DOCUMENTS

| | | | |
|---|---|---|---|
| 3,987,319 | 10/1976 | Nirschl | 340/600 X |
| 4,104,575 | 8/1978 | Bauer | 323/349 X |
| 4,158,804 | 6/1979 | Butler et al. | 323/281 |
| 4,160,934 | 7/1979 | Kirsch | 323/282 X |
| 4,256,978 | 3/1981 | Pinckaers | 323/351 X |
| 4,256,979 | 3/1981 | Hendrickson et al. | 323/351 X |
| 4,445,055 | 4/1984 | Bete | 323/351 X |
| 4,455,526 | 6/1984 | Miller | 323/351 X |
| 4,521,705 | 6/1985 | Bartels | 307/141.4 X |

FOREIGN PATENT DOCUMENTS 0063749 11/1982 European Pat. Off. .
2127956 6/1976 Fed. Rep. of Germany .
2613423 5/1979 Fed. Rep. of Germany .
2711877 9/1979 Fed. Rep. of Germany .
2922309 7/1981 Fed. Rep. of Germany .
2808156 10/1981 Fed. Rep. of Germany .

OTHER PUBLICATIONS

IBM Technical Disclosure Bulletin vol. 26 No. 10A Mar. 1984.
Schmitt Trigger Provides Switch Drive and Regulation for Power Supply by Electronic Design vol. 21 p. 106 Jul. 19, 1973.
U. Tietze-Ch. Schenk Halbleiter-Schaltungstechnik Siebente, Uberarbeitete Auflage, Mit 1017 Abbildungen Springer-Verlag, Berlin, Heidelbeg, New York, Tokyo, 1985, pp. 83–84.

Primary Examiner—William M. Shoop, Jr.
Assistant Examiner—Shik Luen Paul Ip
Attorney, Agent, or Firm—Karl F. Ross; Herbert Dubno

[57] ABSTRACT

An electronic switch of the type having two external lines, one of which is connected to one pole of an operating voltage source in series with a load and the other of which is connected with the load. The switch comprises a sensor, e.g. an oscillator, responsive to proximity of an object thereto and has an output transistor operated by the sensor with blocking and conductive states selectively controlled by the transistor in response to the oscillator. A MOS-FET power transistor is in series with the output transistor and, to reduce the voltage drop in a conducting state of the electronic switch, a self-conducting MOS-FET is used as the MOS-FET power transistor.

7 Claims, 3 Drawing Figures

ELECTRONIC PROXIMITY SWITCH DEVICE

CROSS REFERENCE TO RELATED APPLICATIONS

The present application deals with proximity and like switching devices which are also the subject of the commonly owned copending applications Ser. No. 635,916 filed July 30, 1984, and Ser. No. 635,917 filed July 30, 1984 and referring in turn to other applications and patents which bear upon this subject.

FIELD OF THE INVENTION

My present invention relates to an electronic switching device and, more particularly, to an electronic proximity switch of the type having only two external lines and in which one external line is connected to one pole of a direct-current or an alternating-current source, and a second external line is connected to one side of a load in series with the source, i.e. connected to the other pole or terminal of the source, and which can include a contactless or proximity sensor which responds to the approach of an object, article or person so as to operate a switching amplifier and thereby actuate the load.

BACKGROUND OF THE INVENTION

From the copending applications mentioned above and the references set out herein and various publications which may be mentioned below, it should be apparent that is is known to provide electronic switching units of the contactless or proximity type, i.e. which are responsive to the approach of an actuating influence, generally some body or influence which may affect the frequency or output of a variable frequency oscillator which can constitute the sensing element of the proximity or contactless switch.

The sensor may work into a switching amplifier, i.e. an electronic element responsive to the proximity of the body or influence and which, in turn, controls an output element, generally an output transistor, which can close a load circuit containing the load, e.g. an alarm relay, and a source of electric current in series therewith.

The current supply for the electronic circuit can include a MOS-FET power transistor serving as a constant-voltage generator or as a constant-current generator, the MOS-FET power transistor and the output transistor being connected in series with one another.

Contactless electronic switches of this type are finding increasing use in applications where only the electrical, mechanical and electromechanical switching devices have been used heretofore and indeed wherever actuating contact may be problematical, and mechanical contacts which must physically engage one another may be undesirable or disadvantageous for wear, environmental-deviation and like reasons. Measuring, control and regulation circuits utilize the contactless or proximity-switching devices in increasing numbers.

In general such proximity switches serve to indicate the approach of the affecting element to which the proximity switch may be responsive and, indeed, the approach of the affecting element to a predetermined critical point. Such approach is detected and serves to switch the state of the output transistor so that, for example, a normally blocking output transistor will be rendered conductive or a normally conductive output transistor can be switched into a blocking state depending upon whether closed or open circuit operation of a load is desired.

While I have specifically mentioned proximity of an affecting element to the sensor, thereby indicating that such switches are primarily responsive to proximity to an object to the sensor, this expression should be understood to also include a change in a physical parameter which has an analogous effect on the sensor so that the electronic proximity switching device can also be utilized as a contactless switch for control or other purposes responsive to the physical parameter.

The sensor itself can be an inductively or capacitively influenced oscillator when the proximity switch is to form an inductive or capacitive proximity switch. The sensor may also be constituted by or can include a photoresistor, a photodiode or a phototransistor when the proximity switch is of the optoelectronic type.

Inductive proximity switches, for example, may use an oscillator which oscillates at a fixed frequency as long as a metal article has not approached to within a predetermined distance. The oscillation is affected with an amplitude of the oscillator voltage which generally will lie above a threshold value. When however, the metal article reaches the predetermined distance from the oscillator, the oscillator is subjected to an increased damping and either the oscillation terminates, or the frequency changes, or the amplitude of the oscillator voltage falls below the threshold value.

With capacitive proximity switches, the oscillator generally does not oscillate, or oscillates with a value below a threshold value of the amplitude of the oscillator voltage as long as an affecting element does not increase the capacity between a sensing electrode and a counter electrode sufficiently. When the affecting element, however, approaches within a predetermined distance, the greater capacity thus resulting between the sensing electrode and the counter electrode causes oscillation of the oscillator and an increasing amplitude, above a threshold value of the oscillator voltage. In both cases, the state of the output transistor is dependent upon the amplitude of the oscillator voltage, either directly or via a switching amplifier which is so responsive.

Optoelectronic proximity switches have a light source and a light receiver and may also define a light curtain, i.e. a path crossed by the light beam such that when an article interrupts this path, the contactless switch responds.

One can distinguish between two light-curtain systems. In one such system, the light source and the light receiver, e.g. a photoreceiver, phototransistor or photodiode, are located on opposite sides of the path to be monitored. In another type of light-curtain system, the source and the sensor are located on the same side of the path and, on the opposite side of the path, a reflector may be provided to reflect the light from the emitter to the detector. In both cases, the monitoring of the path involves detecting an interruption in the light curtain by an article traveling along the path.

In yet a third type of photosensitive or optoelectronic contactless switch, the receiver only receives light which is reflected from the affecting element.

As previously mentioned, many, if not all, of these switching systems can have an external line connected with one pole of the operating voltage source and only a single other external line which is connected to the load, the load being connected in series with the source, i.e. to the other pole thereof.

With such systems, the current supply and voltage supply for the sensor and the switching amplifier is not free from problems because the feed voltage or feed current must be applied not only in the conducting state of the switching device but also in the blocking state thereof.

In the present description, I will frequently refer to the supply current or the supply voltage and, indeed, these terms refer to interchangeable concepts. When the supply current falls, so does the supply voltage and it is optional whether current or voltage control is used in most circuits.

When the current supply is drawn at less in part from the operating current source, the switching between the conductive state of the output transistor to the blocking state or vice versa, may result in a substantial change in the feed current or feed voltage available for the sensing components and even the switching amplifier of the circuit.

Indeed, the function of the proximity switch can best be insured by guaranteeing that in the conductive state, there is no significant voltage drop resulting from the conductive state and that in the blocking state there is practically no residual current flowing in the load circuit.

It should be appreciated that with earlier systems utilizing only two external lines as mentioned, it was practically impossible to avoid either a severe voltage drop in the conductive state or a significant residual current in the blocking state. As a consequence, these disadvantages had to be accepted as compromises in such systems.

The problem of reducing the voltage drop in the conductive state of the switch has been dealt with in German patent documents Nos. 19 514 137, 21 27 956, 26 13 423 and 27 11 877.

Electronic switching devices of this kind permit a reduction in the voltage drop in the conductive state, and in other situations it has been proposed to supply the feed current or voltage from a feeder circuit which is constituted by a DC/DC converter because with such a DC/DC converter, the secondary circuit can have a higher converter voltage than the primary circuit so that the voltage drop in the conductive state of the switch can be low, below the requisite feed voltage for the proximity sensor and, if desired, the switching amplifier (see German patent documents-open applications Nos. 28 08 156, 29 22 309 and 33 20 975).

Electronic switching units of the type with which the present invention is concerned can be direct-current switching units, alternating-current switching units or AC/DC switching units, i.e. switching units in which the operating voltage source can be either alternating current or direct current.

With direct-current switching units, it is customary to provide an output transistor as the controlled electronic switch operated by the proximity sensor. With alternating-current switching units, however, the output element controlled by the sensor may an output thyristor.

Since an electronic-switching element having an output thyristor can only be used in conjunction with a direct-current operating voltage source when it is of the gate-turnoff type, for AC/DC switching devices, the electronic output-switching element used is generally an output transistor.

When the switching device has an output transistor, generally one must use a power transistor to be able to carry the requisite load current. Power transistors, however, have problems when they are included in circuits with high operating voltages, of, for example, 220 volts AC which is generally rectified to pulsating DC.

It is known to provide in series with such an output transistor, as will be detailed more fully below, a MOS-FET power transistor. In this case, the MOS-FET power transistor in the blocking state of the swith, can carry the high operating voltage which would otherwise be applied exclusively across the output transistor, the MOS-FET being peculiarly effective because of its construction to serve in this manner as a high-voltage element.

In the state of the art over which the invention is an advance, the voltage drop when the unit switches to the conductive state is relatively high and can be, for example, about 10 volts. As previously noted, such significant voltage drops in switching from one state to the other can be detrimental to the operation and can affect adversely proximity detection, and consequently the response of the circuit.

OBJECTS OF THE INVENTION

It is, accordingly, the principal object of the present invention to provide improved proximity or contactless switching circuits of the aforedescriped type whereby the drawbacks of earlier or prior art circuits are obviated.

Another object of my invention is to provide an improved contactless switch of the type in which an output transistor is provided in series with a MOS-FET, of the class discussed immediately above, but in which in the conducting state of the switch, the voltage drop is drastically reduced over that of prior art systems.

SUMMARY OF THE INVENTION

These objects are attained, in accordance with the invention, in an electronic switch of the type last described above in which the MOS-FET power transistor is self-conducting.

According to a feature of the invention, the drain terminal of the MOS-FET power transistor is connected to the positive pole of the direct current, e.g. the pulsating direct current source which is to be switched through the load. It has been found to be advantageous, moreover, to provide between the MOS-FET power transistor and the output transistor a Zener diode and, indeed, to connect in parallel to the series circuit consisting of the emitter-collector network of the output transistor and the Zener diode a series circuit of a load resistor and a load condenser.

The gate terminal of the MOS-FET power transistor is preferably connected to the negative terminal of the direct current, e.g. pulsating direct-current source.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
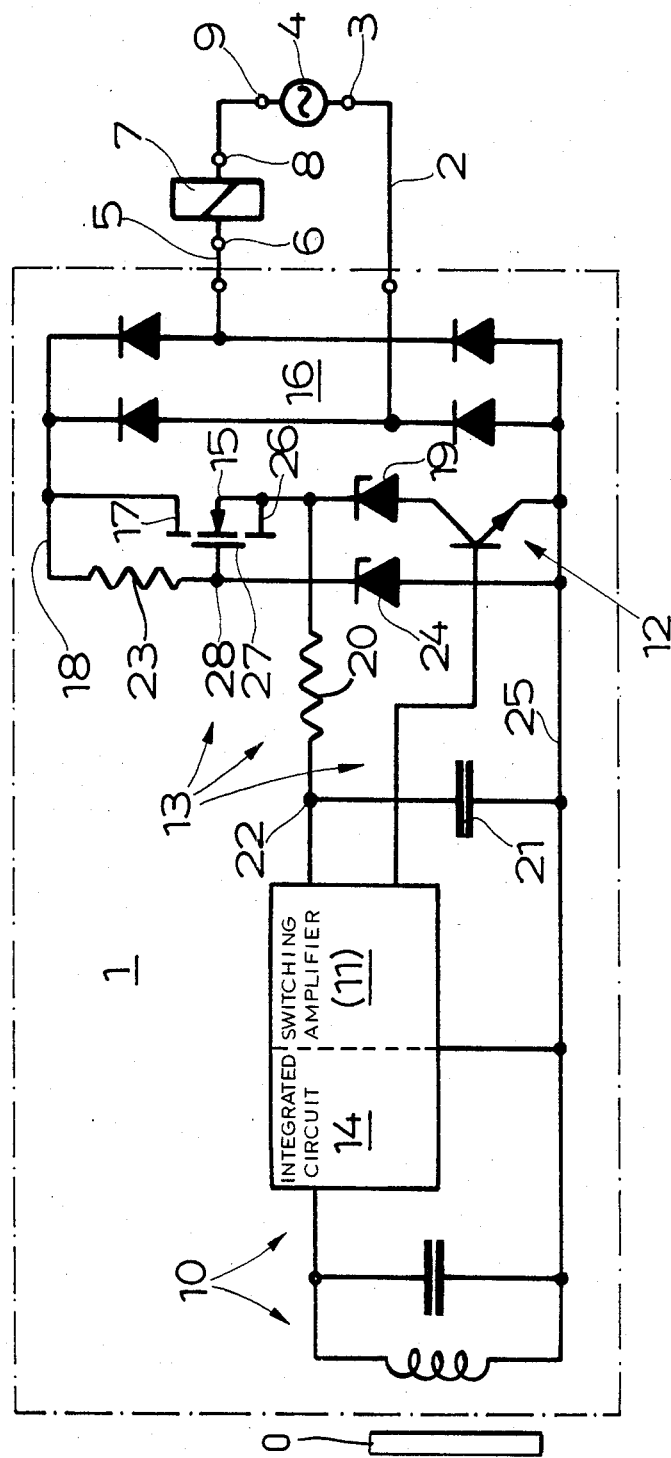
FIG. 1 is a circuit diagram of a prior art circuit over which the present invention is an improvement.
Figure 2:
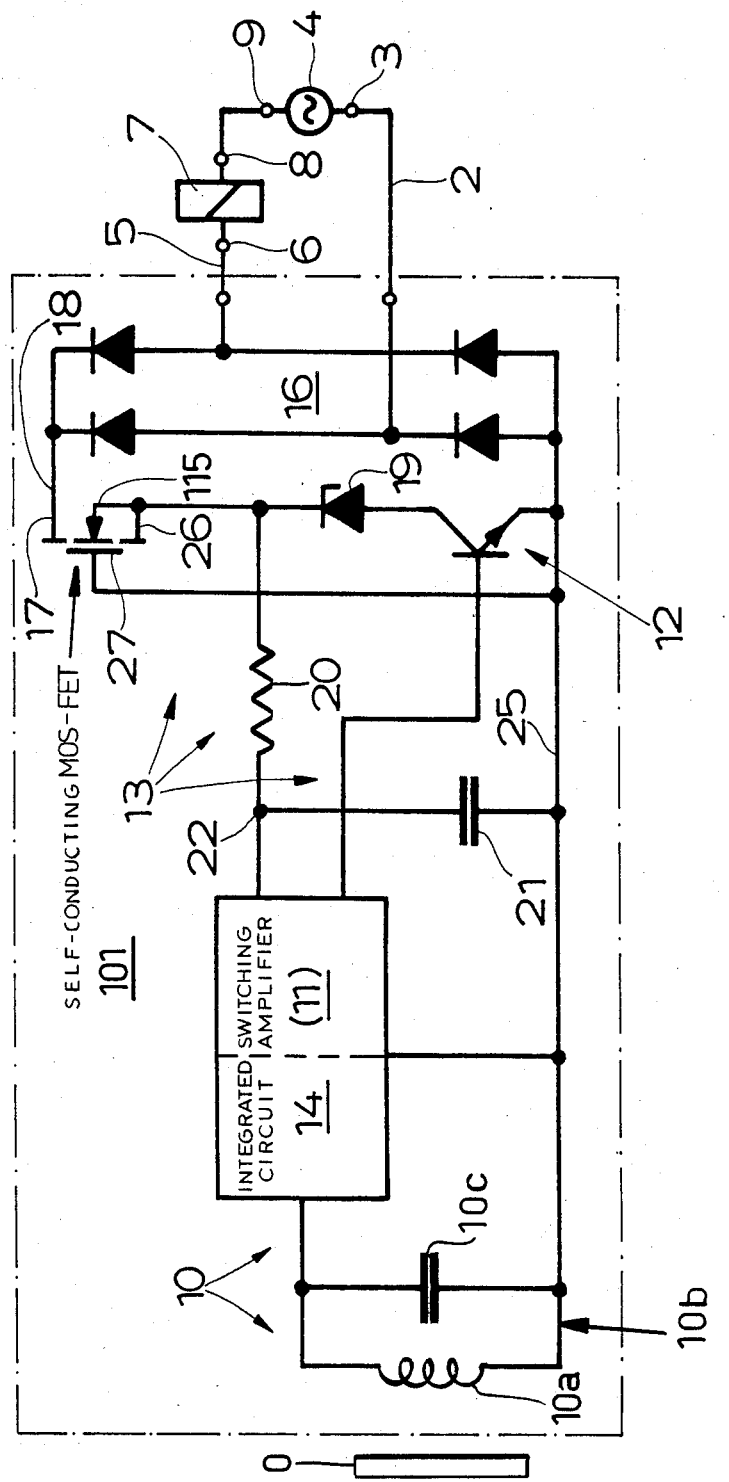
FIG. 2 is a corresponding circuit diagram of the circuit according to the invention.

In FIGS. 1 and 2, equivalent circuit elements have been identified with the same reference numerals and in both cases, the switching circuit 1, 101 operates as a contactless or proximity switch and has a first external line 2 connected with one pole 3 of an operating voltage source 4 which can be a direct current source or an alternating-current source. In the embodiment illustrated, of course, it is an alternating-current source.

Only the one further external line or conductor 4 is provided and this is connected with one terminal 6 of a load 7 which can be a relay, alarm, or other element actuated by the approach of an object to the sensing element of the circuit.

The load 7 has its other terminal 8 actuated to the other pole 9 of the source 4, i.e. the external lines 2 and 5 are connected across a series circuit of the load and the source.

The switching device is thus an AC/DC switching device with only two external lines, i.e. a two-conductor AC/DC switch.

Each of the switches, 1, 101 comprises an externally affected sensor or detector 10 for the presence or proximity of the object, here shown to be a metal plate 0 which approaches the coil 10a of a tank circuit 10b including a capacitor 10c in parallel with the coil 10a and forming part of an oscillator 10 which is included in an integrated circuit element 14 together with a switching amplifier 11 (see the aforementioned copending applications).

Basically, therefore, the circuits of FIGS. 1 and 2 thus include an oscillator 10 responsive to the proximity of an affecting object, a switching amplifier 11, an output transistor 12 controlled by the sensor 10 through the switching amplifier 11 and a feed circuit which provides the output and also supplies the requisite electric current to the integrated circuit 14, i.e. supplies a feed voltage or current for the detector 10 and the switching amplifier 11.

The feed circuit 13 includes in the prior art unit of FIG. 1 a MOS-FET power transistor which serves as a constant-voltage generator or a constant-current generator.

It should be clear that it is not important whether the feed circuit is considered a voltage-supply circuit or a current-supply circuit, the particular supply being a function of what is required for the integrated circuit 14 or for the detector 10 and the switching or trigger amplifier 11. Consequently, it is also not significant whether the MOS-FET power transistor is treated as a constant-voltage generator or as a constant-current generator.

Furthermore, so that applicant's use of the term "constant" is not misunderstood, it should be noted that this expression does not mean "constant" over time in the sense that the supply voltage is invariable over a period of the alternating-current source nor does it mean that the voltage or current is held constant within extremely narrow limits.

What it does mean is that the current or voltage is held within reasonable limits given the variation in the supply voltage over a period without significant perturbations resulting from the switching of the load.

The MOS-FET power transistor 15 thus is effective as a constant-voltage generator or constant-current generator only to the extent that the sensor 10 and the switching amplifier 11 are fed with the necessary supply and the necessary supply current independently of the level of the operating voltage when this does not fall below a minimum value and does not exceed a maximum value.

The MOS-FET transistor thus prevents a circumstance in which in the blocking state of the switch 12, the residual current through the circuit 1 will be more or less linearly dependent upon the level of the operating voltage. Only this function should be understood as the function of the constant-voltage generator or constant-current generator.

As is also apparent from FIGS. 1 and 2, the MOS-FET power transistor 15 and 115 is connected in series with the emitter-collector terminals of the output transistor 12. In this case, therefore, the MOS-FET power transistor 15 or 115 can take up the high voltage of the source 4 which is applied in the blocked condition of the switching device 1, 101.

In FIGS. 1 and 2, moreover, the switching device 1, 101 are provided with respective rectifier bridges 16 which rectify the alternating current from the source 4 so that the power applied to the series circuit of the MOS-FET power transistor 15 or 115 and the output transistor 12 is a pulsating DC voltage.

FIGS. 1 and 2 also show that the drain terminal 17 of the MOS-FET 15 or 115 is connected to the positive terminal of the pulsating DC voltage, i.e. the positive terminal of the bridge 16, this being applicable not only in the prior art circuit of FIG. 1 but also in the circuit of FIG. 2 of the instant invention. Between the MOS-FET 15 or 115 and the output transistor 12, in each case, a Zener diode 19 is provided and the series circuit formed by the Zener diode 19 and the emitter-collector network of the transistor 12 is bridged with a series network of a load resistor 20 and a load condenser 21.

By contrast with the circuit of FIG. 1, however, the circuit of FIG. 2 has a reduced voltage drop which can amount to about 6volts and results from the sum of the voltage drops in the bridge 16, the voltage drop along the drain-source path of the MOS-FET transistor 115, the voltage drop at the Zener diode 19 and the voltage drop across the emitter-collector network of the output transistor 12. The contribution of the drain-source stretch to the voltage drop is minimized through the use of the self-conducting MOS-FET power transistor which eliminates the comparatively higher voltage drop of the stretch between the drain 17 and the source 27 of the MOS-FET 15 in the prior art circuit of FIG. 1.

In the circuit of FIG. 1, the bias for the MOS-FET 15 is provided by the series circuit of a current limiting resistor 23 and a further Zener diode 24 connected between the positive pole 18 of the pulsating direct-current source and the negative pole 25 thereof. The source terminal 26 of the MOS-FET 15, like the source terminal of the MOS-FET 115 is connected to the junction between the resistor 20 and the Zener diode 19. In both cases as well the gate 27 of the MOS-FET transistor 15 or 115 is connected to the junction 28 of the current limiting resistor 23 and the further Zener diode 24.

By contrast, the gate terminal 27 of the MOS-FET 115 is connected directly to the negative pole 25 of the pulsating DC source.

In prior art circuit of FIG. 1, by contrast with the switch 101 of FIG. 2, the voltage drop in the conducting state is relatively high and can be 10 volts or more resulting from the sum of the rectifier bridge voltage drop, the gate-source voltage required at the MOS- FET 15, the voltage drop of the Zener diode 19 and the voltage drop of the emitter-collector stretch of the output transistor 12.

Figure 3:
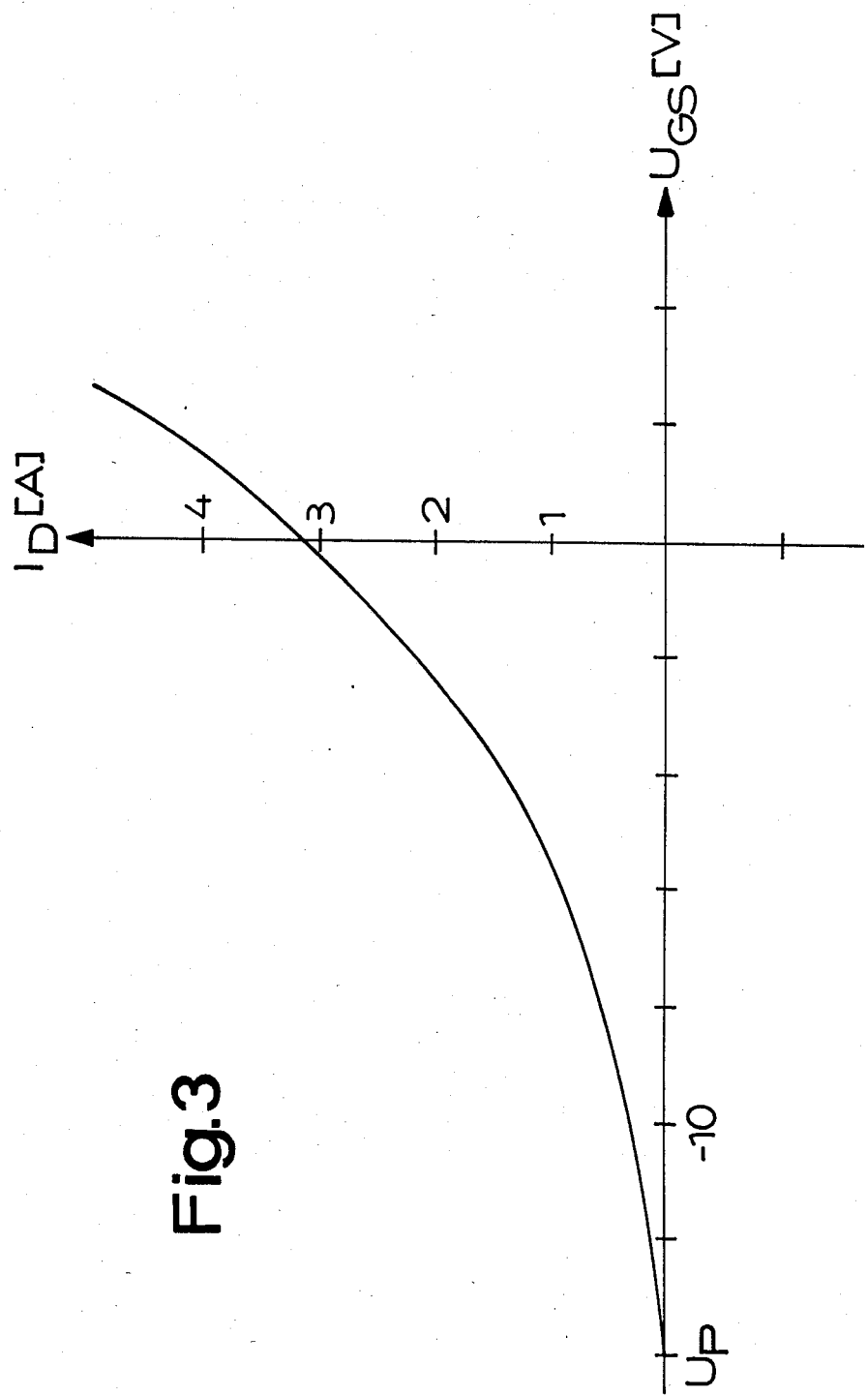
FIG. 3 is a graph showing the characteristic of the self-conducting power transistor used in the circuit of FIG. 2.

Thus the comparatively high voltage drop across the MOS-FET in the conducting state of the circuit of FIG. 1 is eliminated with the circuit of FIG. 2 which has the further advantage that it eliminates the need for the current limiting resistor 23 and the Zener diode 24. The characteristic of the self-conducting MOS-FET 115 has been shown in FIG. 3 in which the gate-source voltage is plotted along the abscissa against the drain current along the ordinate.

I claim:

1. In an electronic switch having two external lines one of which is connected to one pole of an operating voltage source in series with a load and the other of which is connected to the load, wherein said electronic switch comprises a sensor responsive to proximity of an object thereto, an output transistor operated by said sensor and having blocking and conductive states selectively controlled by said sensor, and a feed circuit for supplying electrical power to said sensor and including a MOS-FET power transistor in series with a Zener diode and said output transistor and connected to external lines, the improvement wherein said MOS-FET power transistor is a self-conducting MOS-FET.

2. The improvement defined in claim 1 wherein said MOS-FET has a drain terminal connected to a positive pole of a direct-current source.

3. The improvement defined in claim 2 wherein said Zener diode and an emitter-collector stretch to said output transistor forms a series network which is bridged by a series connection of a load resistor and a load condenser.

4. The improvement defined in claim 1 wherein said MOS-FET has a gate terminal connected to a negative pole of a direct-current source.

5. A proximity switch which comprises:
 a proximity sensor including an oscillator having a sensing element responsive to the approach of an affecting object;
 a switching amplifier connected to an oscillator and having an output and a current-feed input;
 a rectifier bridge having a positive pole and a negative pole and a bridge diagonal including a source of alternating current in series with a load to be operated by the proximity switch, said negative pole being connected to said oscillator and said amplifier;
 an output transistor having its base connected to said output of said switching amplifier and an emitter-collector stretch; and
 a self-conducting MOS-FET semiconductor having a drain connected to said positive pole, a source connected to said input of said switching amplifier, and a gate connected directly to said negative pole, said emitter-collector stretch being connected in series with a gate-drain stretch of said MOS-FET power transistor, a load resistor being connected between said source and said input of said switching amplifier, a load condenser being connected between said input of said switching amplifier and said negative pole, a Zener diode being connected in series between said emitter-collector stretch and said drain-source stretch.

6. The electronic switch defined in claim 5 wherein a load condenser is connected between said input of said switching amplifier and said negative pole.

7. The electronic switch defined in claim 6 wherein said load resistor is connected to a junction between said source and said Zener diode.

* * * * *